(12) United States Patent
Ikegami et al.

(10) Patent No.: US 9,488,828 B2
(45) Date of Patent: Nov. 8, 2016

(54) OPTICAL DEFLECTOR APPARATUS CAPABLE OF INCREASING OFFSET DEFLECTING AMOUNT OF MIRROR

(71) Applicant: STANLEY ELECTRIC CO., LTD., Meguro-ku, Tokyo (JP)

(72) Inventors: Keiichi Ikegami, Hachioji (JP); Akio Ogawa, Yamato (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/733,371

(22) Filed: Jun. 8, 2015

(65) Prior Publication Data
US 2015/0362724 A1 Dec. 17, 2015

(30) Foreign Application Priority Data

Jun. 12, 2014 (JP) ................................. 2014-121658

(51) Int. Cl.
*G02B 26/08* (2006.01)

(52) U.S. Cl.
CPC ................................ *G02B 26/0858* (2013.01)

(58) Field of Classification Search
CPC ....................... G02B 26/0833; G02B 26/0858
USPC .......................................... 359/199.4, 200.8
See application file for complete search history.

(56) References Cited

U.S. PATENT DOCUMENTS

| 7,605,965 | B2* | 10/2009 | Tani ..................... G02B 26/105 310/331 |
| 2007/0008401 | A1 | 1/2007 | Cannon et al. |
| 2014/0126923 | A1* | 5/2014 | Mizutani ............ G02B 26/0833 399/51 |
| 2014/0355089 | A1 | 12/2014 | Murayama et al. |

FOREIGN PATENT DOCUMENTS

| JP | 2008178173 A | 7/2008 |
| JP | 2012198314 A | 10/2012 |
| WO | 2010131556 A1 | 11/2010 |
| WO | 2013114917 A1 | 8/2013 |

OTHER PUBLICATIONS

Extended European Search Report dated Nov. 4, 2015, issued in counterpart European Application No. 15171555.4.

* cited by examiner

*Primary Examiner* — James Phan
(74) *Attorney, Agent, or Firm* — Holtz, Holtz & Volek PC

(57) ABSTRACT

In an optical deflector apparatus including a mirror, an inner frame, an outer frame, an inner piezoelectric actuator adapted to flex the mirror around an axis of the mirror, an outer piezoelectric actuator adapted to flex the mirror around the axis of the mirror, and a driver adapted to generate an offset drive voltage and a rocking drive voltage. The offset drive voltage is applied to a first piezoelectric actuator selected from the inner piezoelectric actuator and the outer piezoelectric actuator. The rocking drive voltage is applied to a second piezoelectric actuator different from the first piezoelectric actuator.

12 Claims, 17 Drawing Sheets

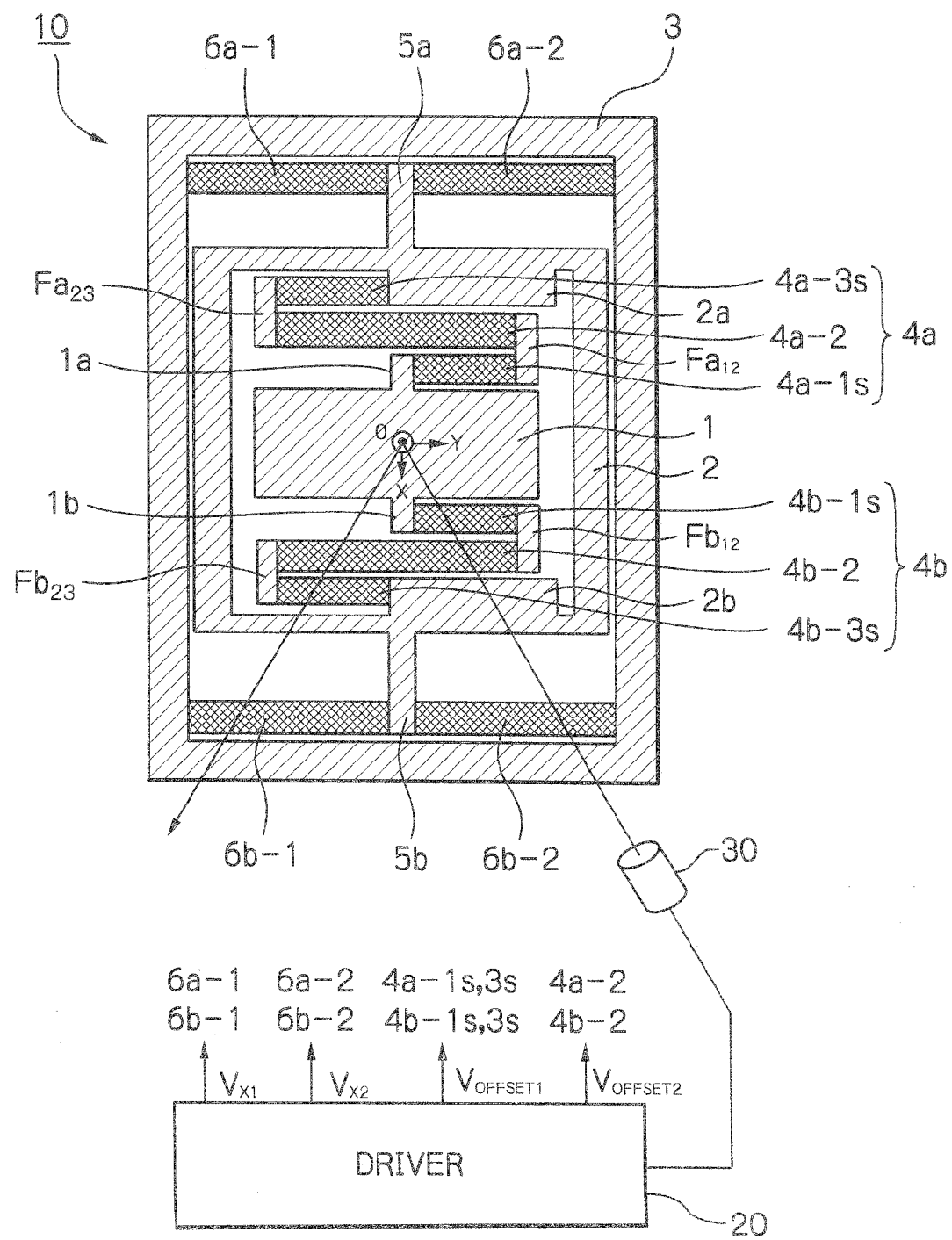

OPTICAL DEFLECTOR APPARATUS CAPABLE OF INCREASING OFFSET DEFLECTING AMOUNT OF MIRROR

This application claims the priority benefit under 35 U.S.C. §119 to Japanese Patent Application No. JP2014-121658 filed on Jun. 12, 2014, which disclosure is hereby incorporated in its entirety by reference.

BACKGROUND

1. Field

The presently disclosed subject matter relates to an optical deflector apparatus. The optical deflector apparatus can be applied as an optical scanner to a laser pico projector, a laser radar, a bar code reader, an area sensor, an adaptive front-lighting system (AFS) type head lamp, a head-up display unit, and other optical apparatuses, to generate scanning light.

2. Description of the Related Art

Generally, in an optical scanner or the like, an optical deflector apparatus is constructed by a micro electro mechanical system (MEMS) device manufactured by using semiconductor manufacturing processes and micro machine technology.

A prior art optical deflector apparatus as a MEMS device is constructed by a mirror, an outer frame (fixed frame) surrounding the mirror, piezoelectric actuators coupled between the mirror and the outer frame, serving as cantilevers for rocking the mirror with respect to an axis (X-axis) of the mirror in a rocking operation mode (see: JP2012-198314A).

On the other hand, in an AFS control, when a steering angle read from a steering angle sensor or the like is larger than a predetermined value, the area of high luminous intensities needs to be shifted from a central position of the head lamp to a right side or a left side of the head lamp, to substantially decline the optical axis of the head lamp while the visibility in a high-beam mode is maintained. If such an AFC control is applied to the above-described prior art optical deflector apparatus, an offset voltage is applied to the piezoelectric actuators to deflect the mirror around the X-axis. This is called an offset operation mode.

In the above-described prior art optical deflector apparatus, when a rocking operation mode and an offset operation are simultaneously carried out, rocking drive voltages are offset by an offset voltage corresponding to the shifted amount of the optical axis of the head lamp, for example. In other words, the offset voltage is combined with the rocking drive voltages to generate combined drive voltages which are applied to the piezoelectric actuators (see: FIGS. 14, 15, 16 and 17 of JP2012-198314A). In this case, the piezoelectric actuators are used commonly for a rocking operation mode and an offset operation mode.

In the above-described prior art optical deflector apparatus, however, when the combined drive voltages become larger than a threshold value corresponding to the maximum rocking angle of the mirror with respect to the X-axis of the mirror, the piezoelectric actuators would be damaged. Therefore, the offset voltage is limited, so that the combined drive voltages do not exceed the threshold value. As a result, the offset deflecting amount of the mirror cannot be increased. Otherwise, if the offset voltage is caused to be increased, the rocking drive voltages need to be decreased. In this case, it is impossible to increase the rocking amount of the mirror.

SUMMARY

The presently disclosed subject matter seeks to solve the above-described problems.

According to the presently disclosed subject matter, an optical deflector apparatus includes a mirror, an inner frame surrounding the mirror, an outer frame surrounding the inner frame, an inner piezoelectric actuator coupled between the mirror and the inner frame and adapted to flex the mirror around an axis of the mirror, an outer piezoelectric actuator coupled between the inner frame and the outer frame and adapted to flex the mirror around the axis of the mirror, and a driver adapted to generate an offset drive voltage and a rocking drive voltage. The offset drive voltage is applied to a first piezoelectric actuator selected from the inner piezoelectric actuator and the outer piezoelectric actuator. The rocking drive voltage is applied to a second piezoelectric actuator different from the first piezoelectric actuator, selected from the inner piezoelectric actuator and the outer piezoelectric actuator.

According to the presently disclosed subject matter, since the first piezoelectric actuator for an offset operation mode is independent of the second piezoelectric actuator for a rocking operation mode, the offset deflecting amount (angle) can be increased, and also, the rocking amount (angle) can be increased.

BRIEF DESCRIPTION OF THE DRAWINGS

The above and other advantages and features of the presently disclosed subject matter will be more apparent from the following description of certain embodiments, taken in conjunction with the accompanying drawings, wherein:

FIG. 1 is a plan view illustrating a first embodiment of the optical deflector apparatus according to the presently disclosed subject matter;

DETAILED DESCRIPTION OF EXEMPLARY EMBODIMENTS

Figure 2A:
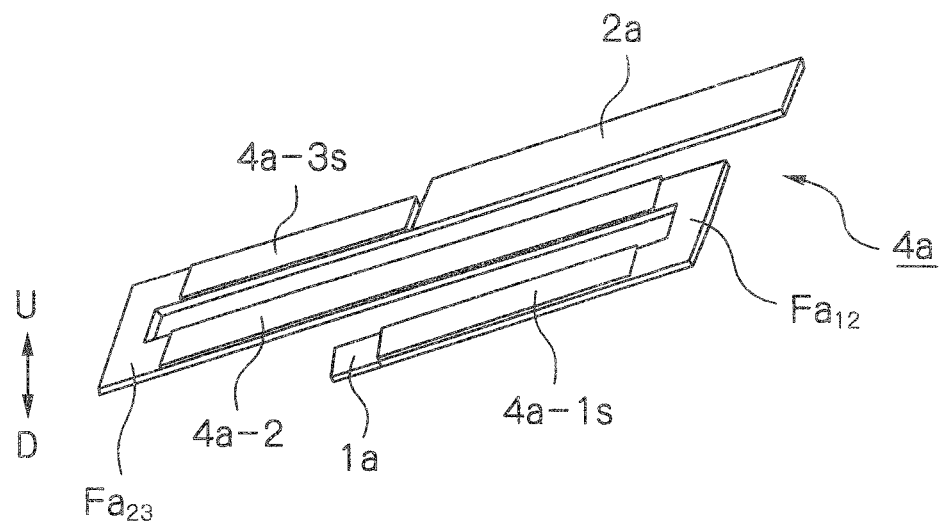
FIGS. 2A and 2B are views for explaining the operation of the inner piezoelectric actuator of FIG. 1.
Figure 2B:
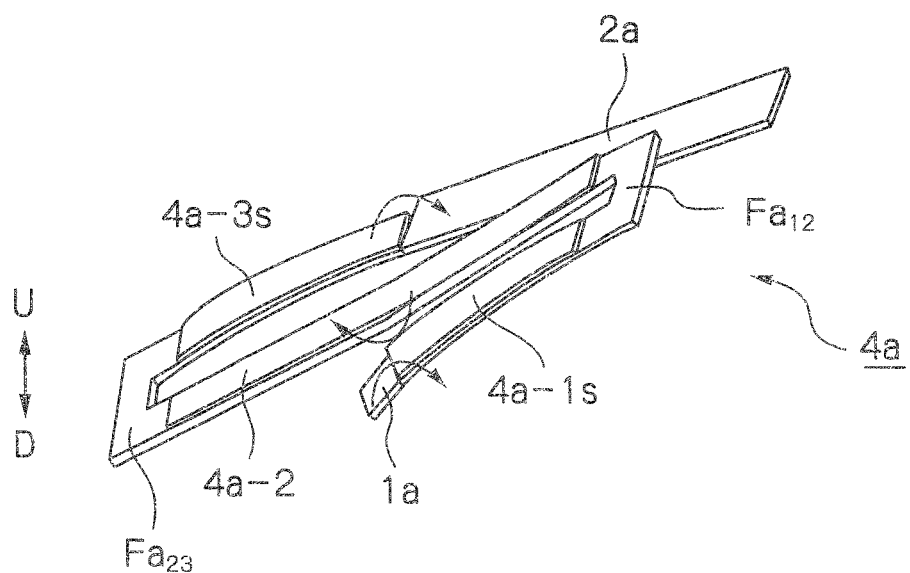

In FIG. 1, which illustrates a first embodiment of the optical deflector apparatus according to the presently disclosed subject matter as a one-dimensional MEMS device, reference numeral 10 designates a one-dimensional optical deflector, 20 designates a driver for driving the optical deflector 10, and 30 designates a laser light source.

The optical deflector 10 is constructed by a rectangular mirror 1 for reflecting incident light L from the laser light source 30, a rectangular inner frame (movable frame) 2 surrounding the mirror 1, and a rectangular outer frame (fixed frame) surrounding the inner frame 2.

Also, in order to realize an offset operation mode, a pair of meander-type inner piezoelectric actuators 4a and 4b are coupled between coupling portions 1a and 1b of the mirror 1 and inner coupling portions 2a and 2b of the inner frame 2 and serving as cantilevers for rocking the mirror 1 around an X-axis on the plane of the mirror 1 centered at the center 0 of the mirror 1. The inner piezoelectric actuators 4a and 4b are arranged opposite to each other with respect to the mirror 1.

Further, in order to realize a rocking operation mode, a pair of torsion bars 5a and 5b are coupled to outer circumferences of the inner frame 2 along the X-axis. Also, linear outer piezoelectric actuators 6a-1 and 6a-2 are coupled between the torsion bar 5a and the outer frame 3, and linear outer piezoelectric actuators 6b-1 and 6b-2 are coupled between the torsion bar 5b and the outer frame 3. In this case, the flexing direction of the outer piezoelectric actuators 6a-1 and 6b-1 are opposite to that of the outer piezoelectric actuators 6b-1 and 6b-2, so that the outer piezoelectric actuators 6a-1, 6a-2, 6b-1 and 6b-2 serve as cantilevers for rocking the mirror 1 around the X-axis. Note that the torsion bars 5a and 5b can be coupled to the outer frame 3.

The mirror 1 can be square, rectangular, polygonal or elliptical.

The meander-type inner piezoelectric actuators 4a and 4b are symmetrical to each other with respect to the Y-axis.

In more detail, the meander-type inner piezoelectric actuator 4a is constructed by piezoelectric cantilevers 4a-1s, 4a-2 and 4a-3s which are serially-coupled from the coupling portion 1a of the mirror 1 to a coupling portion 2a of the inner frame 2 via folded portions $Fa_{12}$ and $Fa_{23}$. Also, each of the piezoelectric cantilevers 4a-1s, 4a-2 and 4a-3s is in parallel with the Y-axis. Therefore, the piezoelectric cantilevers 4a-1s, 4a-2 and 4a-3s are folded at their ends or meandering from the mirror 1 to the inner frame 2, so that the amplitudes of the piezoelectric cantilevers 4a-1s, 4a-2 and 4a-3s can be changed along directions perpendicular to the X-axis.

Similarly, the meander-type inner piezoelectric actuator 4b is constructed by piezoelectric cantilevers 4b-1s, 4b-2 and 4b-3s which are serially-coupled from the coupling portion 1b of the mirror 1 to an inner coupling portion 2b of the inner frame 2 via folded portions $Fb_{12}$ and $Fb_{23}$. Also, each of the piezoelectric cantilevers 4b-1s, 4b-2 and 4b-3s are in parallel with the Y-axis. Therefore, the piezoelectric cantilevers 4b-1s, 4b-2 and 4b-3s are folded at their ends or meandering from the mirror 1 to the inner frame 2, so that the piezoelectric cantilevers 4b-1s, 4b-2 and 4b-3s can be changed along directions perpendicular to the X-axis.

The meander-type inner piezoelectric actuators 4a (4b) operate as follows.

In the inner piezoelectric actuators 4a (4b), the piezoelectric cantilevers 4a-1s, 4a-2 and 4a-3s (4b-1s, 4b-2 and 4b-3s) are divided into an odd-numbered group of the piezoelectric cantilevers 4a-1s and 4a-3s (4b-1s and 4b-3s), and an even-numbered group of the piezoelectric cantilever 4a-2 (4b-2) alternating with the odd-numbered group of the piezoelectric cantilevers 4a-1s and 4a-3s (4b-1s and 4b-3s).

When no drive voltages are applied to the piezoelectric cantilevers 4a-1s, 4a-2 and 4a-3s, the piezoelectric cantilevers 4a-1s, 4a-2 and 4a-3s are as illustrated in FIG. 2A.

On the other hand, when a first drive voltage is applied to the odd-numbered group of the piezoelectric cantilevers 4a-1s and 4a-3s and a second drive voltage opposite in phase to the first drive voltage is applied to the even-numbered group of the piezoelectric cantilever 4a-2, for example, the odd-numbered group of the piezoelectric cantilever 4a-1s and 4a-3s are flexed in one direction, for example, in an upward direction U, and the even-numbered group of the piezoelectric cantilever 4a-2 is flexed in the other direction, i.e., in a downward direction D. Otherwise, the odd-numbered group of the piezoelectric cantilevers 4a-is and 4a-3s are flexed in the downward direction D, the even-numbered group of the piezoelectric cantilever 4a-2 is flexed in the upward direction U. In this case, since the length of each of the piezoelectric cantilever 4a-1s and 4a-3s is about half of that of the piezoelectric cantilever 4a-2, the flexing amounts of the piezoelectric cantilevers 4a-1s and 4a-3s are about half of that of the piezoelectric cantilever 4a-2; however, the flexing center of the piezoelectric actuator 4a is close to the center thereof.

Thus, the mirror 1 is flexed around the X-axis by the inner piezoelectric actuators 4a and 4b.

Note that the number of piezoelectric cantilevers in each of the inner piezoelectric actuators 4a and 4b can be other values such as 4, 5, . . . .

Returning to FIG. 1, the torsion bars 5a and 5b have ends coupled to the outer circumference of the inner frame 2. Therefore, the torsion bars 5a and 5b are twisted by the outer piezoelectric actuators 6a-1, 6a-2, 6b-1 and 6b-2 to rock the mirror 1 around the X-axis. Other ends of the torsion bars 5a and 5b can be coupled to the inner circumference of the outer frame 3.

A method for manufacturing the optical deflector 10 of FIG. 1 is explained with reference to FIG. 3.

First, a silicon-on-insulator (SOI) structure constructed by a monocrystalline silicon support layer ("Handle" layer) 301, an intermediate (buried) silicon dioxide layer ("Box" layer) 302, and a monocrystalline silicon active layer ("Device" layer) 303 is prepared. Also, by a thermal oxidation process, a silicon dioxide layer 304 is formed on the support layer 301, and a silicon dioxide layer 305 is formed on the active layer 303. Further, piezoelectric actuator cantilevers 4a-1s, 4a-2, 4a-3s, 4b-1s, 4b-2, 4b-3s and the piezoelectric actuators 6b-1 and 6b-2 are formed on the silicon dioxide layer 305.

Next, a Pt/Ti lower electrode layer 306 consisting of an about 50 nm thick Ti and an about 150 nm thick Pt on Ti is formed by a sputtering process. Then, an about 3 μm thick PZT layer 307 is deposited on the lower electrode layer 306 by an arc discharge reactive ion plating (ADRIP) process at a temperature of about 500° C. to 600° C. Then, an about 150 nm thick Ti upper electrode layer 308 is formed on the PZT layer 307 by a sputtering process.

Next, the upper electrode layer 308 and the PZT layer 307 are patterned by a photolithography and etching process. Then, the lower electrode layer 306 and the silicon dioxide layer 305 are patterned by a photolithography and etching process.

Next, an about 500 nm thick silicon dioxide interlayer 309 is formed on the entire surface by a plasma chemical vapor deposition (CVD) process.

Next, contact holes are perforated in the silicon dioxide interlayer 309 by a photolithography and dry etching process. The contact holes correspond to the piezoelectric cantilevers 4a-1s, 4a-2, 4a-3s, 4b-1s, 4b-2 and 4b-3s, the piezoelectric actuators 6a-1, 6a-2, 6b-1 and 6b-2 and the pads P formed on the outer frame 3.

Next, wiring layers 310 made of AlCu (1% Cu) are formed by a photolithography process, a sputtering process, and a lift-off process. The wiring layers 310 are electrically connected between the upper electrode layers 308 of the piezoelectric cantilevers 4a-1s, 4a-2, 4a-3s, 4b-1s, 4b-2 and 4b-3s and the piezoelectric actuators 6a-1, 6a-2, 6b-1 and 6b-2 and their corresponding pads P.

Next, the silicon dioxide layer 304 is etched by a photolithography and dry etching process, so that the silicon dioxide layer 304 is left in an area corresponding to the inner frame 2 and the outer frame 3.

Next, the support layer 301 is etched by a dry etching process using the silicon dioxide layer 304 as an etching mask. Then, the silicon dioxide layer 302 is etched by a wet etching process using the support layer 301 as an etching mask.

Finally, an aluminum (Al) reflective metal layer 311 is formed by an evaporation process on the active layer 303, and is patterned by a photolithography and etching process, thus completing the optical deflector 10.

In Fig, 3, the torsion bars 5a and 5b are formed by the active layer 303.

Figure 4:
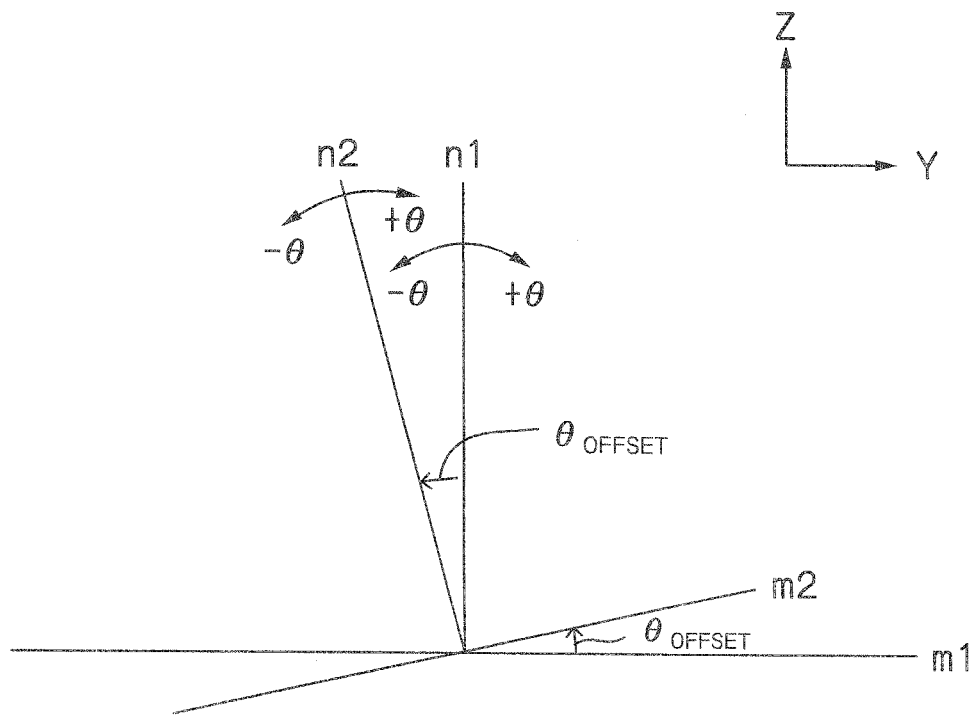
FIG. 4 is a graph for explaining the relationship between the deflection angle and offset angle of the mirror of FIG. 1.

FIG. 4 is a graph for explaining the deflection angle and offset angle of the mirror 1 of FIG. 1.

The driver 20 controls the outer piezoelectric actuators 6a-1, 6a-2, 6b-1 and 6b-2 using sinusoidal-wave voltages $V_{X1}$ and $V_{X2}$ opposite in phase to each other, so that the rocking angle of the mirror 1 is from $-\theta$ to $+\theta$ with respect to a normal line n1 normal to the plane m1 of the mirror 1 as illustrated in FIG. 4.

On the other hand, the driver 20 controls the inner piezoelectric actuators 4a and 4b using saw-tooth drive voltages $V_{OFFSET1}$ and $V_{OFFSET2}$ opposite in phase to each other, so that the rocking angle of the mirror 1 is shifted by $\theta_{OFFSET}$, so that the plane m1 of the mirror 1 is rotated by $\theta_{OFFSET}$ to a plane m2 with a normal line n2 as illustrated in FIG. 4. In this state, the driver 20 also controls the outer piezoelectric actuators 6a-1, 6a-2, 6b-1 and 6b-2 using the above-mentioned sinusoidal-wave voltages $V_{X1}$ and $V_{X2}$, so that the rocking angle of the mirror 1 is from $-\theta$ to $+\theta$ with respect to the normal line n2, i. e. , from $-\theta-\theta_{OFFSET}$ to $+\theta-\theta_{OFFSET}$ with respect to the normal line n1. For example, the rocking angle of the mirror 1 from $-10°$ to $+10°$ with respect to the normal line n1 is changed by the offset angle $\theta_{OFFSET}5°$ of the inner piezoelectric actuators 4a and 4b to the rocking angle of the mirror 1 from $-15°$ to $+5°$ with respect to the normal line n1.

The rocking operation of the mirror 1 by the outer piezoelectric actuators 6a-1, 6a-2, 6b-1 and 6b-2 in a rocking operation mode around the X-axis will be explained below.

Figure 5A:
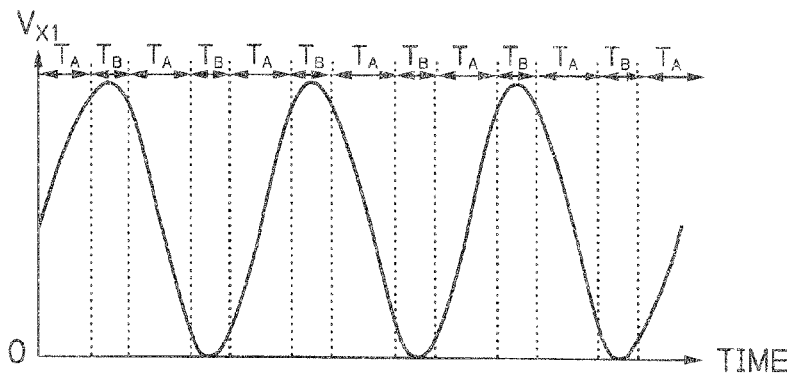
FIGS. 5A, 5B, 5C and 5D are timing diagrams of the drive voltages applied to the piezoelectric actuators of FIG. 1.
Figure 5B:
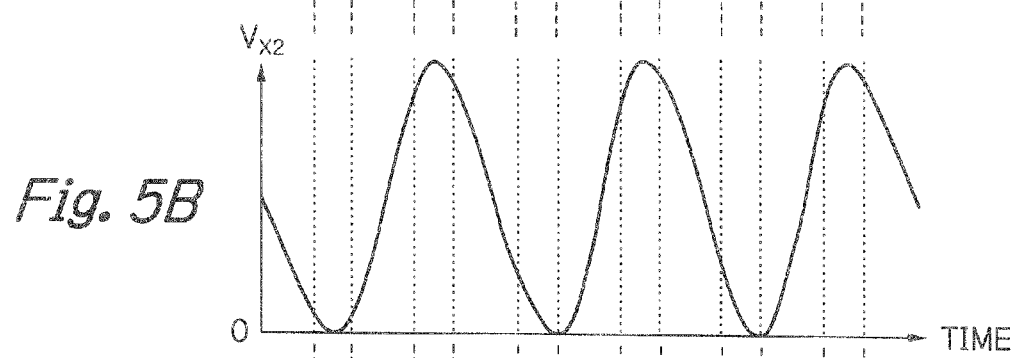

Rocking sinusoidal-wave drive voltages $V_{X1}$ and $V_{X2}$ opposite in phase to each other as illustrated in FIGS. 5A and 5B are applied by the driver 20 to the outer piezoelectric actuators 6a-1 and 6a-2, respectively, so that the outer piezoelectric actuators 6a-1 and 6a-2 carry out flexing operations in opposite directions to each other, which would distort the torsion bar 5a in a direction to cause a torque in the mirror 1 around the X-axis. Simultaneously, the above-mentioned rocking sinusoidal-wave drive voltages $V_{X1}$ and $V_{X2}$ are applied by the driver 20 to the outer piezoelectric actuators 6b-1 and 6b-2, respectively, so that the outer piezoelectric actuators 6b-1 and 6b-2 carry out flexing operations in opposite directions to each other, which also would distort the torsion bar 5b in the above-mentioned direction to cause a torque in the mirror 1 around the X-axis. As a result, the torsion bars 5a and 5b are twisted to rock the mirror 1 around the X-axis. In this case, if the frequency $f_X$ of the sinusoidal-wave drive voltages $V_{X1}$ and $V_{X2}$ is a resonant frequency such as 20 kHz of a mechanical vibrating system of the mirror 1 with respect to the X-axis depending upon the mirror 1, the inner frame 2 and the inner piezoelectric actuators 4a and 4b, the rocking angle of the mirror 1 can further be enhanced.

The offset operation of the mirror 1 by the inner piezoelectric actuators 4a and 4b in an offset operation mode will be explained below.

Figure 5C:
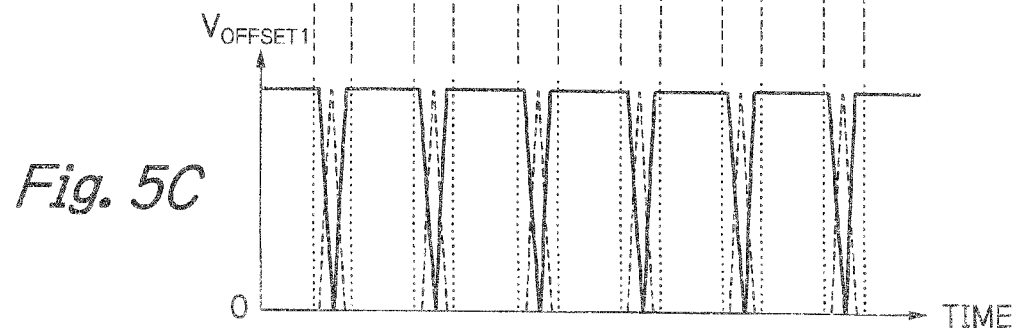
Figure 5D:
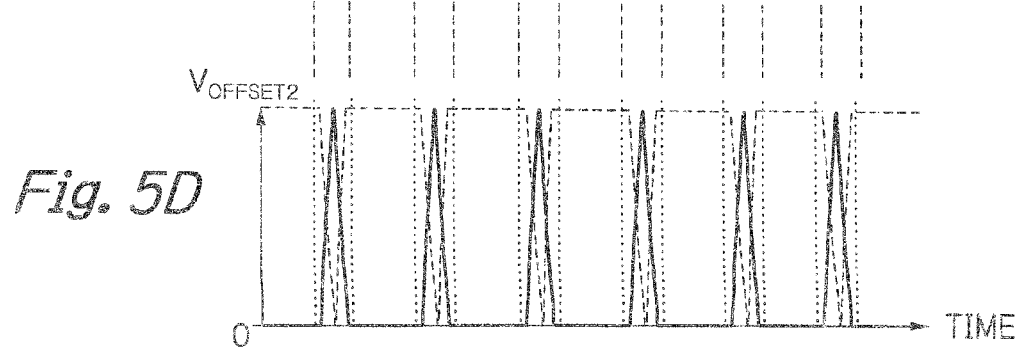

An offset saw-tooth drive voltage $V_{OFFSET1}$ as illustrated in FIG. 5C is applied by the driver 20 to the odd-numbered piezoelectric cantilevers 4a-1s and 4a-3s of the inner piezoelectric actuator 4a and the odd-numbered. piezoelectric cantilevers 4b-1s and 4b-3s of the inner piezoelectric actuator 4b. Simultaneously, an offset drive voltage $V_{OFFSET2}$ as illustrated in FIG. 5D opposite in phase to the offset drive voltage $V_{OFFSET1}$ is applied by the driver 20 to the even-numbered piezoelectric cantilever 4a-2 of the inner piezoelectric actuator 4a and the even-numbered piezoelectric cantilever 4b-2 of the inner piezoelectric actuator 4b. Therefore, the odd-numbered piezoelectric cantilevers 4a-1s, 4a-3s; 4b-1s, 4b-3s and the even-numbered piezoelectric cantilevers 4a-2 and 4b-2 carry out flexing operations in opposite directions to each other. As a result, the mirror 1 is flexed in one direction.

For example, in a positive offset angle, the offset drive voltage $V_{OFFSET1}$ is rectangular-wave shaped as indicated by a solid line in FIG. 5C, while the offset drive voltage $V_{OFFSET2}$ is pulse-shaped as indicated by a solid line in FIG. 5D. In this case, the offset drive voltage $V_{OFFSET2}$ can be L(low level). Contrary to this, in a negative offset angle, the offset drive voltage $V_{OFFSET1}$ is pulse-shaped as indicated by a dotted line in FIG. 5C, while the offset drive voltage $V_{OFFSET2}$ is rectangular-wave shaped as indicated by a dotted line FIG. 5D. In this case, the offset drive voltage $V_{OFFSET1}$ can be L (low level). The offset drive voltages $V_{OFFSET1}$ and $V_{OFFSET2}$ have the same frequency $f_X$ of the rocking sinusoidal-wave drive voltages $V_{X1}$, and $V_{X2}$. The amplitude of the rectangular-waved offset drive voltage $V_{OFFSET1}$ or $V_{OFFSET2}$ corresponds to an offset angle of the mirror 1.

In FIGS. 5A, 5B, 5C and 5D, $T_A$ is an image active period, and $T_B$ is a blanking period. That is, in a horizontal scanning by the rocking sinusoidal-wave drive voltages $V_{X1}$ and $V_{X2}$, the scanning speed is constant in the image active period $T_A$, while the scanning speed is low in the blanking period $T_B$. Therefore, since image display is impossible in the blanking period $T_B$, the offset drive voltages $V_{OFFSET1}$ and $V_{OFFSET2}$ are inactive or pulse-shaped.

In addition, the offset drive voltages $V_{OFFSET1}$ and $V_{OFFSET2}$ can always be active even in the blanking period $T_B$; however, in this case, charges may be stored in the PZT layer 308 so that the polarization within the PZT layer 308 would be decreased to decrease the offset angle of the mirror 1. Contrary to this, as stated above, when the offset drive voltages $V_{OFFSET1}$ and $V_{OFFSET2}$ are caused to be inactive or pulse-shaped in the blanking period $T_B$, the charges stored in the PZT layer 308 are emitted to recover the offset angle corresponding to the rectangular-waved offset drive voltage $V_{OFFSET1}$ or $V_{OFFSET2}$ in the active period $T_A$.

In the meander type piezoelectric actuators 4a and 4b of FIG. 1, the lengths of the piezoelectric cantilevers can be the same, so that the flexing amounts of the piezoelectric cantilevers can be enhanced. Also, the piezoelectric cantilevers 4a-1s, 4a-2 and 4a-3s and the piezoelectric cantilevers 4b-1s, 4b-2 and 4b-3s can be symmetrical with respect to the center 0 of the mirror 1. In this case, the offset drive voltage $V_{OFFSET1}$ is applied to the piezoelectric cantilevers 4a-1s, 4a-3s and 4b-2, while the offset drive voltage $V_{OFFSET2}$ is applied to the piezoelectric cantilevers 4b-1s, 4b-3s and 4a-2. Further, the meander-type piezoelectric cantilevers 4a and 4b can be provided between the inner frame 2 and the outer frame 3, while the piezoelectric actuators 6a-1 and 6a-2 along with the torsion bars 4a and 4b can be provided between the mirror 1 and the inner frame 2.

Figure 6:
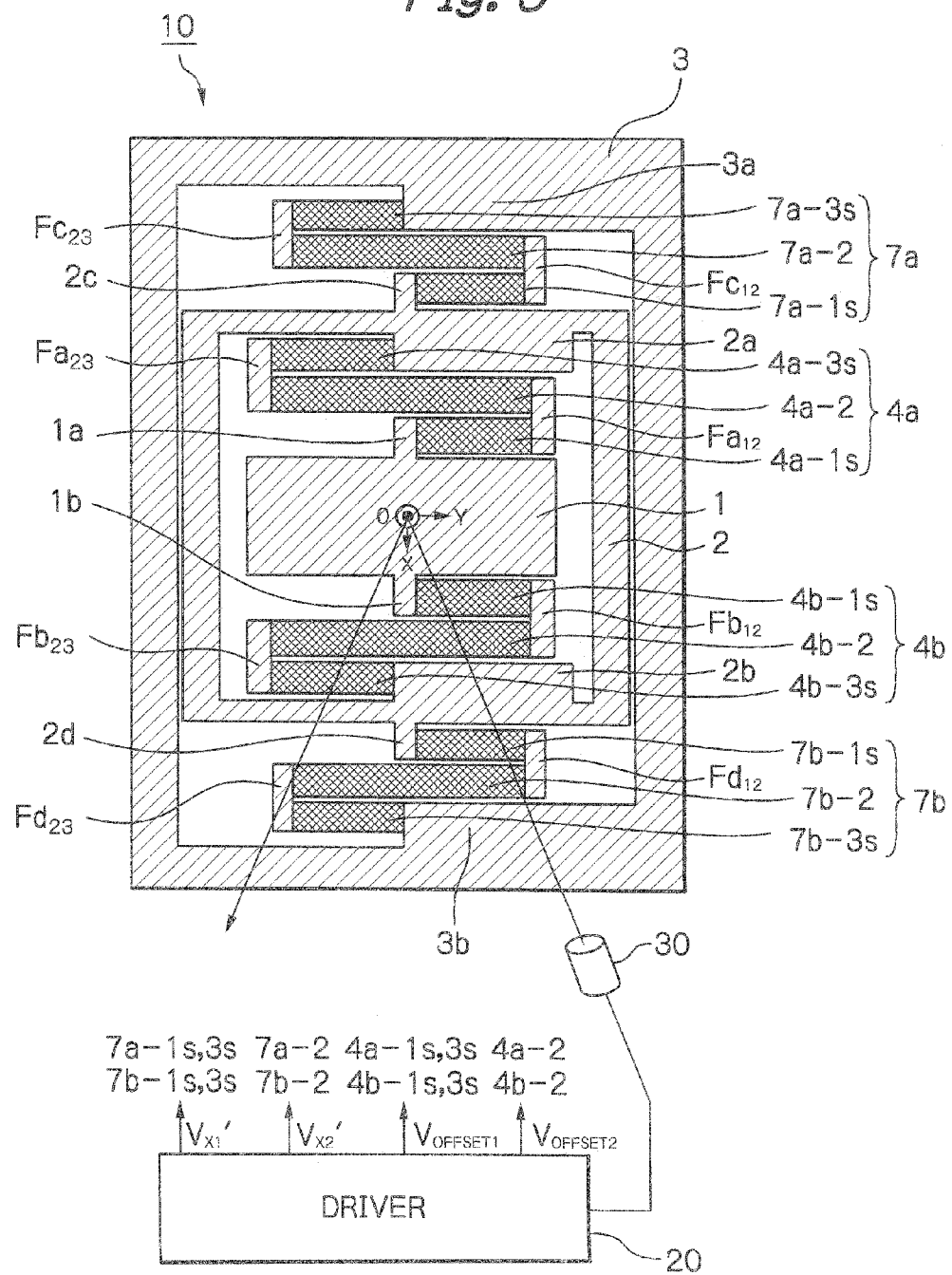
FIG. 6 is a plan view illustrating a second embodiment of the optical deflector apparatus according to the presently disclosed subject matter.

In FIG. 6, which illustrates a second embodiment of the optical deflector apparatus according to the presently disclosed subject matter, the torsion bars 5a and 5b and the outer piezoelectric actuators 6a-1, 6a-2, 6b-1 and 6b-2 of FIG. 1 are replaced by a pair of meander-type outer piezoelectric actuators 7a and 7b which are symmetrical to each other with respect to the Y-axis.

In more detail, the meander-type outer piezoelectric actuator 7a is constructed by piezoelectric cantilevers 7a-1s, 7a-2 and 7a-3s which are serially-coupled from a coupling portion 2c of the inner frame 2 to a coupling portion 3a of the outer frame 3 via folded portions $Fc_{12}$ and $Fc_{23}$. Also, each of the piezoelectric cantilevers 7a-1s, 7a-2 and 7a-3s is in parallel with the Y-axis. Therefore, the piezoelectric cantilevers 7a-1s, 7a-2 and 7a-3s are folded at their ends or meandering from the inner frame 2 to the outer frame 3 so that the amplitudes of the piezoelectric cantilevers 7a-1s, 7a-2 and 7a-3s can be changed along directions perpendicular to the X-axis.

Similarly, the meander-type outer piezoelectric actuator 7b is constructed by piezoelectric cantilevers 7b-1s, 7b-2 and 7b-3s which are serially-coupled from a coupling portion 2d of the inner frame 2 to a coupling portion 3b of the outer frame 3 via folded portions $Fd_{12}$ and $Fd_{23}$. Also, each of the piezoelectric cantilevers 7b-1s, 7b-2 and 7b-3s are in parallel with the Y-axis. Therefore, the piezoelectric cantilevers 7b-1s, 7b-2 and 7b-3s are folded at their ends or meandering from the inner frame 2 to the outer frame 3 so that the piezoelectric cantilevers 7b-1s, 7b-2 and 7b-3s can be changed along directions perpendicular to the X-axis.

The meander-type outer piezoelectric actuators 7a (7b) operate in the same way as the inner piezoelectric actuators 4a (4b).

Thus, the mirror 1 is rocked around the X-axis by the outer piezoelectric actuators 7a and 7b.

Note that the number of piezoelectric cantilevers in each of the outer piezoelectric actuators 7a and 7b can be other values such as 4, 5, . . . .

The rocking operation of the mirror 1 by the outer piezoelectric actuators 7a and 7b in a rocking operation mode around the X-axis will be explained below.

Figure 7:
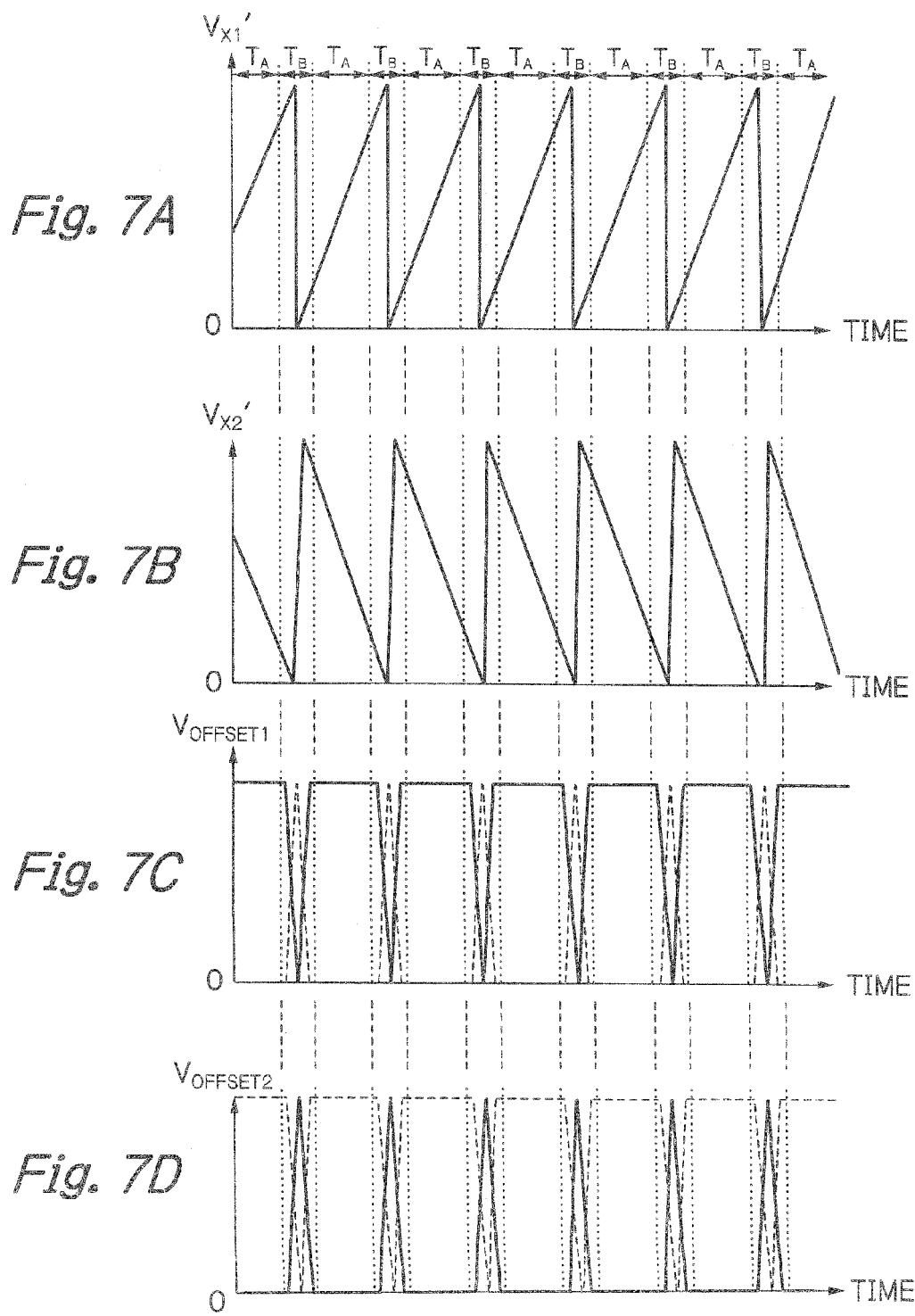
FIGS. 7A, 7B, 7C and 7D are timing diagrams of the drive voltages applied to the piezoelectric actuators of FIG. 6.

A rocking saw-tooth drive voltage $V_{X1}'$ as illustrated in FIG. 7A is applied by the driver 20 to the odd-numbered piezoelectric cantilevers 7a-1s and 7a-3s of the outer piezoelectric actuator 7a and the odd-numbered piezoelectric cantilevers 7b-1s and 7b-3s of the inner piezoelectric actuator 7b. Simultaneously, a rocking saw-tooth drive voltage $V_{X2}'$ as illustrated in FIG. 7B is applied by the driver 20 to the even-numbered piezoelectric cantilever 7a-2 of the outer piezoelectric actuator 7a and the even-numbered piezoelectric cantilever 7b-2 of the outer piezoelectric actuator 7b. Therefore, the odd-numbered piezoelectric cantilevers 7s-1s, 7a-3s; 7b-1s, 7b-3s and the even-numbered piezoelectric cantilevers 7a-2 and 7b-2 carry out flexing operations in opposite directions to each other. As a result, the mirror 1 is rocked around the X-axis.

In FIG. 6, the meander-type outer piezoelectric actuators 7a and 7b are specialized for a rocking operation mode around the X-axis, and the meander-type inner piezoelectric actuators 4a and 4b are specialized for an offset operation mode around the X-axis. However, the meander-type inner piezoelectric actuators 4a and 4b can be specialized for a rocking operation mode around the X-axis, and the meander-type outer piezoelectric actuators 7a and 7b can be specialized for an offset operation mode around the X-axis.

Figure 8:
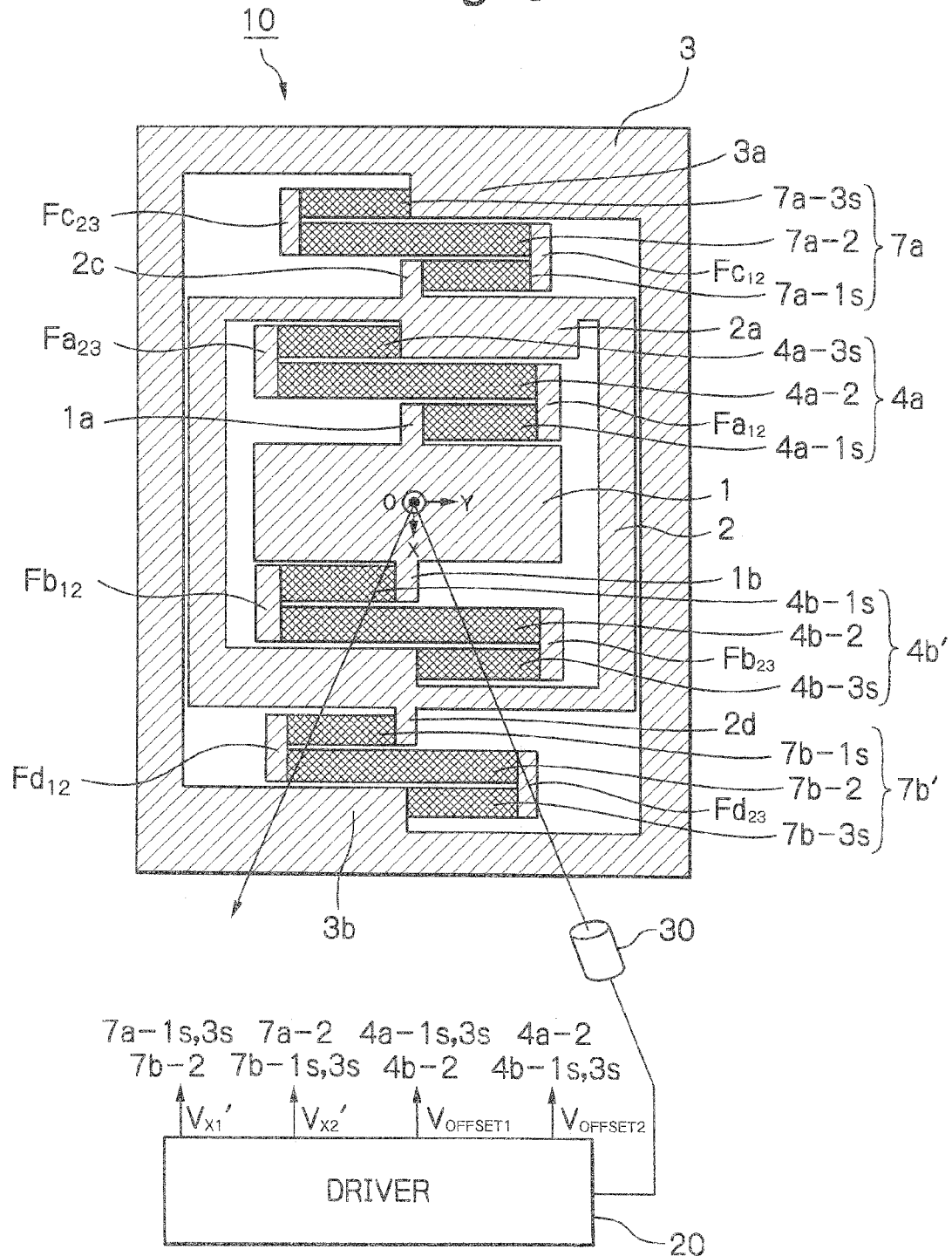
FIG. 8 is a plan view illustrating a first modification of the optical deflector apparatus of FIG. 6.

In FIG. 8, which illustrates a first modification of the optical deflector apparatus of FIG. 6, the meander-type inner piezoelectric actuator 4b of FIG. 6 is replaced by a meander-type inner piezoelectric actuator 4b' which is symmetrical to the meander-type inner piezoelectric actuator 4a with respect to the center 0 of the mirror 1, and the meander-type outer piezoelectric actuator 7b of FIG. 6 is replaced by a meander-type outer piezoelectric actuator 7b' which is symmetrical to the meander-type inner piezoelectric actuator 7a with respect to the center 0 of the mirror 1. The operation of the optical deflector of FIG. 8 is the same as that of the optical deflector of FIG. 6, except the following. The rocking saw-tooth drive voltage $V_{X1}'$ is applied by the driver 20 to the piezoelectric cantilevers 7a-1s, 7a-3s and 7b-2, and the rocking saw-tooth drive voltage $V_{X2}'$ is applied by the driver 20 to the piezoelectric cantilevers 7a-2, 7b-1s and 7b-3s. Also, the offset saw-tooth drive voltage $V_{OFFSET1}$ is applied by the driver 20 to the piezoelectric cantilevers 4a-1s, 4a-3s and 4b-2 and the offset saw-tooth drive voltage $V_{OFFSET2}$ is applied by the driver 20 to the piezoelectric cantilevers 4a-2, 4b-1s and 4b-3s.

Figure 9:
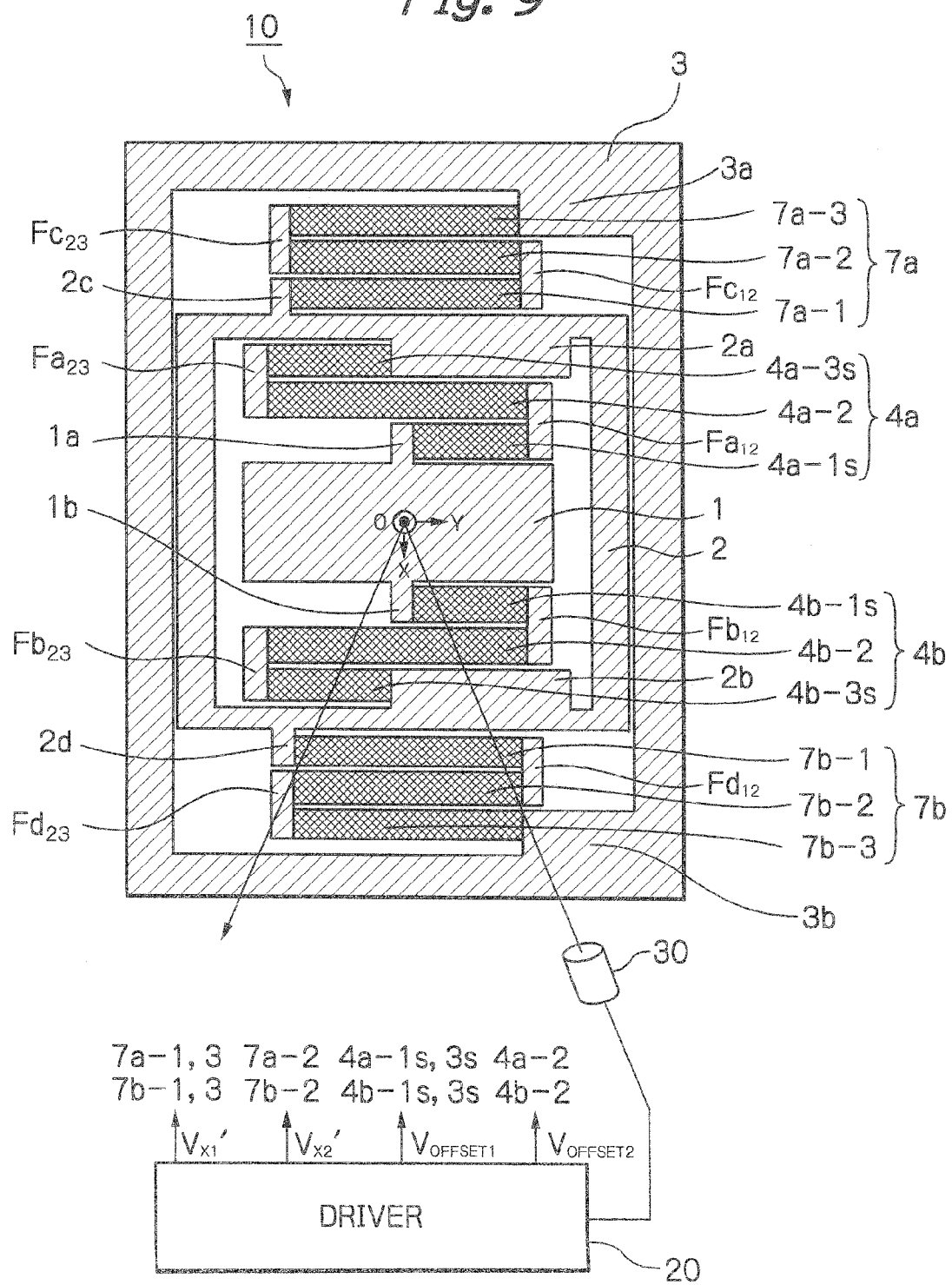
FIG. 9 is a plan view illustrating a second modification of the optical deflector apparatus of FIG. 6.

In FIG. 9, which illustrates a second modification of the optical deflector apparatus of FIG. 6, the piezoelectric cantilevers 7a-1s, 7a-3s, 7b-1s and 7b-3s of FIG. 6 are replaced by piezoelectric cantilevers 7a-1, 7a-3, 7b-1 and 7b-3, respectively, whose length is the same as that of the piezoelectric cantilevers 7a-2 and 7b-2. The operation of the optical deflector of FIG. 9 is the same as that of the optical deflector of FIG. 6, except that the rocking saw-tooth drive voltage $V_{X1}'$ is applied by the driver 20 to the piezoelectric cantilevers 7a-1, 7a-3, 7b-1 and 7b-3.

Figure 10:
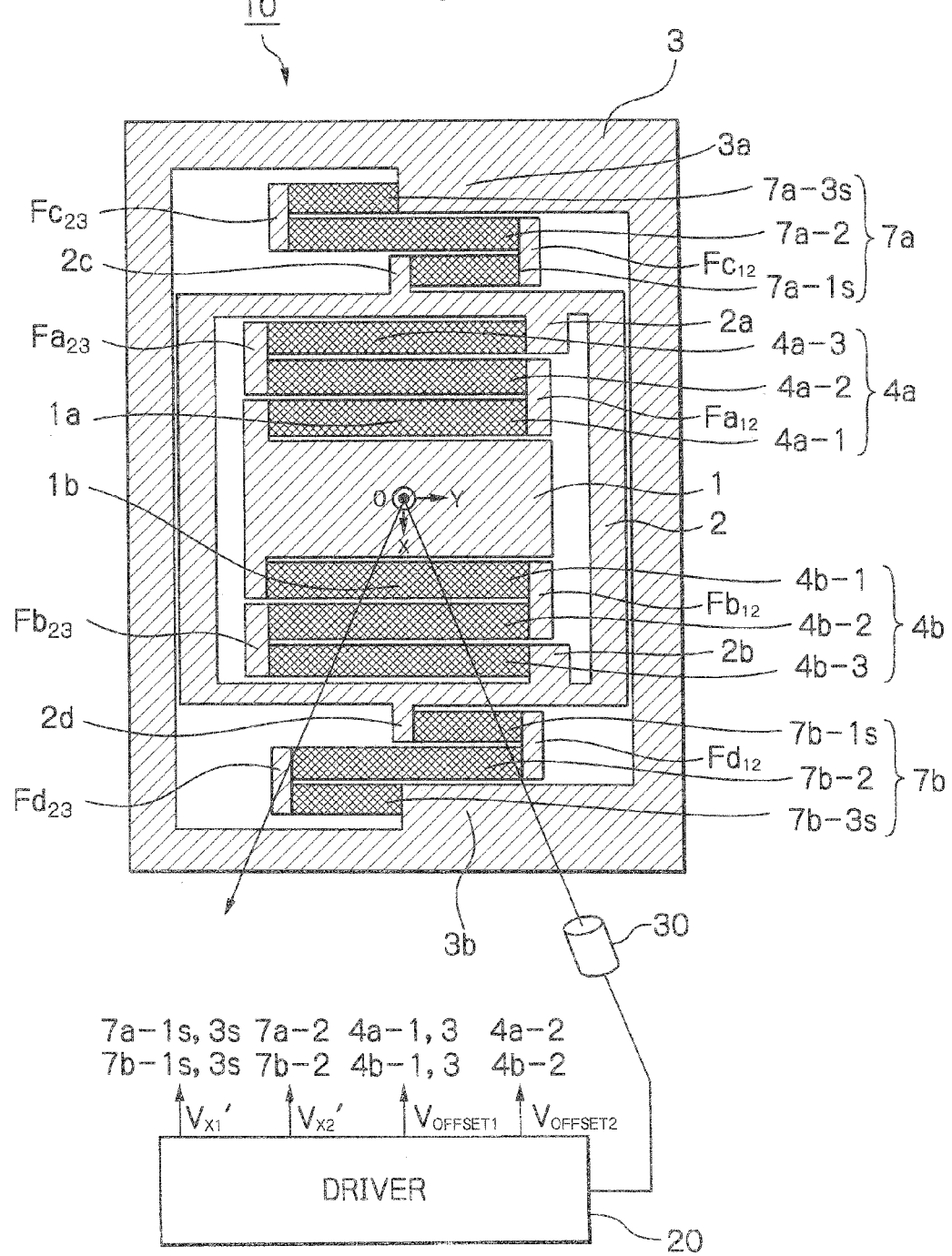
FIG. 10 is a plan view illustrating a third modification of the optical deflector apparatus of FIG. 6.

In FIG. 10, which illustrates a third modification of the optical deflector apparatus of FIG. 6, the piezoelectric cantilevers 4a-1s, 4a-3s, 4b-1s and 4b-3s of FIG. 6 are replaced by piezoelectric cantilevers 4a-1, 4a-3, 4b-1 and 4b-3, respectively, whose length is the same as that of the piezoelectric cantilevers 4a-2 and 4b-2. The operation of the optical deflector of FIG. 10 is the same as that of the optical deflector of FIG. 6, except that the offset saw-tooth drive voltage $V_{OFFSET1}$ is applied by the driver 20 to the piezoelectric cantilevers 4a-1, 4a-3, 4b-1 and 4b-3.

Figure 11:
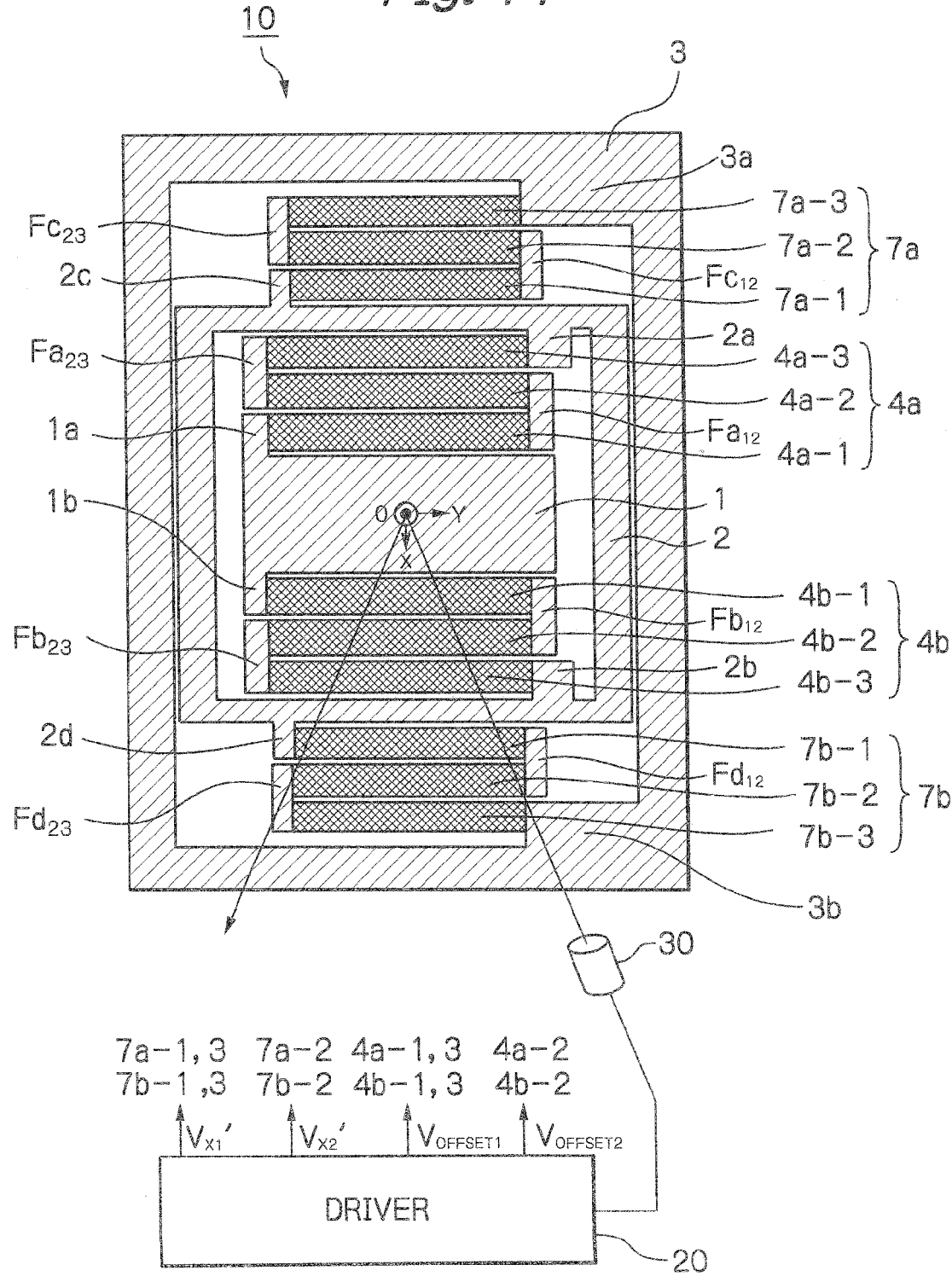
FIG. 11 is a plan view illustrating a fourth modification of the optical deflector apparatus of FIG. 6.

In FIG. 11, which illustrates a fourth modification of the optical deflector apparatus of FIG. 6, the piezoelectric cantilevers 4a-1s, 4a-3s, 4b-1s, 4b-3s, 7a-1s, 7a-3s, 7b-1s and 7b-3s of FIG. 6 are replaced by piezoelectric cantilevers 4a-1, 4a-3, 4b-1, 4b-3, 7a-1, 7a-3, 7b-1 and 7b-3, respectively, whose length is the same as that of the piezoelectric cantilevers 4a-2 and 4b-2 and the piezoelectric cantilevers 7a-2 and 7b-2. The operation of the optical deflector of FIG. 11 is the same as that of the optical deflector of FIG. 6, except for the following. The rocking saw-tooth drive voltage $V_{X1}'$ is applied by the driver 20 to the piezoelectric cantilevers 7a-1, 7a-3, 7b-1 and 7b-3. Also, the offset saw-tooth drive voltage $V_{OFFSET1}$ is applied by the driver 20 to the piezoelectric cantilevers 4a-1, 4a-3, 4b-1 and 4b-3.

Figure 12:
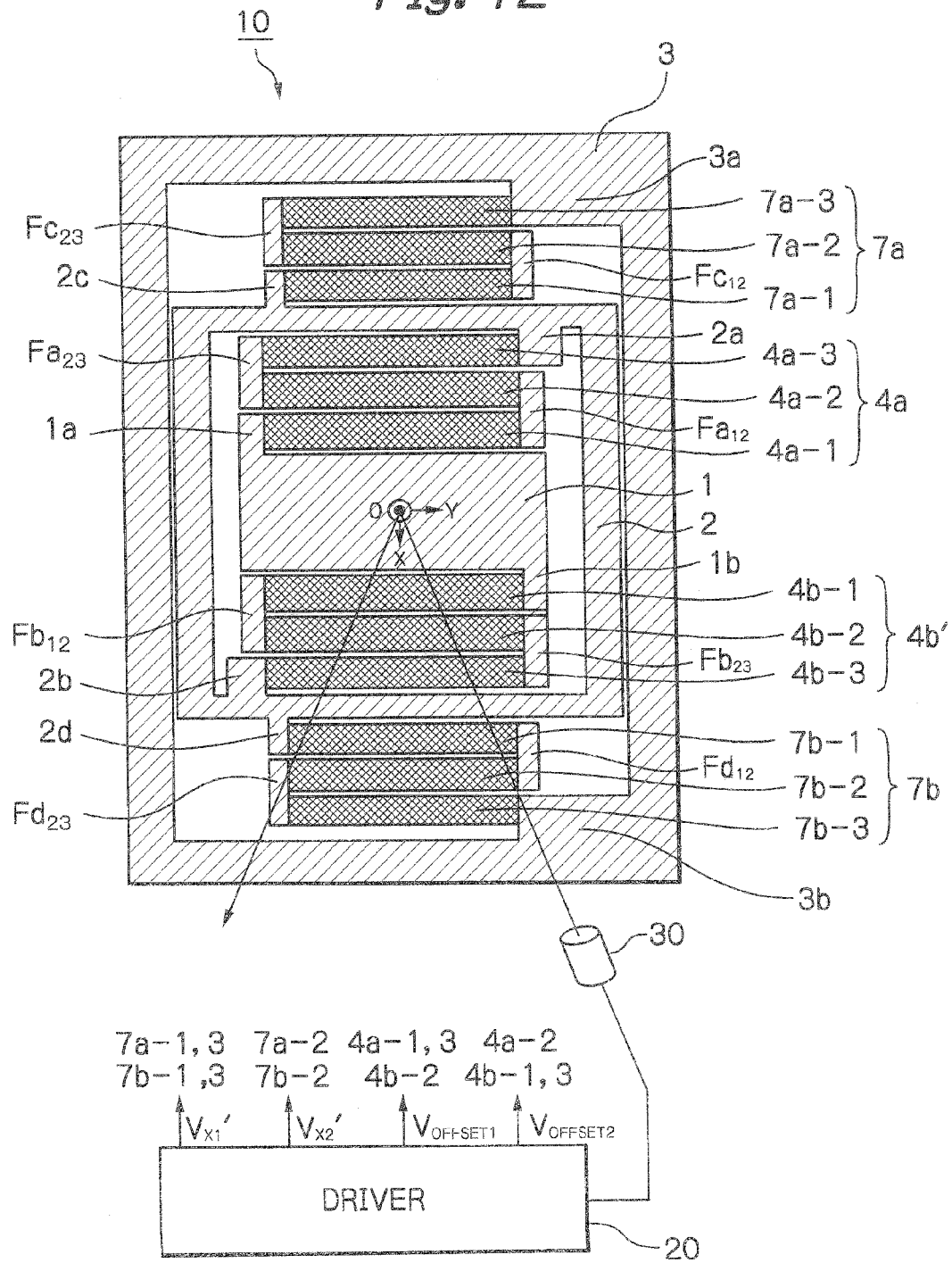
FIG. 12 is a plan view illustrating a fifth modification of the optical deflector apparatus of FIG. 6.

In FIG. 12, which illustrates a fifth modification of the optical deflector apparatus of FIG. 6, the piezoelectric cantilevers 4a-1s, 4a-3s, 4b-1s and 4b-3s, 7a-1s, 7a-3s, 7b-1s and 7b-3s of FIG. 6 are replaced by piezoelectric cantilevers 4a-1, 4a-3, 4b-1, 4b-3, 7a-1, 7a-3, 7b-1 and 7b-3, respectively, whose length is the same as that of the piezoelectric cantilevers 4a-2 and 4b-2 and the piezoelectric cantilevers 7a-2, and 7b-2. Additionally, the meander-type inner piezoelectric actuator 4b of FIG. 6 is replaced by a meander-type inner piezoelectric actuator 4b' which is symmetrical to the meander-type inner piezoelectric actuator 4a with respect to the center 0 of the mirror 1. The operation of the optical deflector of FIG. 12 is the same as that of the optical deflector of FIG. 6, except for the following. The rocking saw-tooth drive voltage $V_{X1}'$ is applied by the driver 20 to the piezoelectric cantilevers 7a-1, 7a-3, 7b-1 and 7b-3. Also, the offset saw-tooth drive voltage $V_{OFFSET1}$ is applied by the driver 20 to the piezoelectric cantilevers 4a-1, 4a-3 and 4b-2, and the offset saw--tooth drive voltage $V_{OFFSET2}$ is applied by the driver 20 to the piezoelectric cantilevers 4a-2, 4b-1 and 4b-3.

Figure 13:
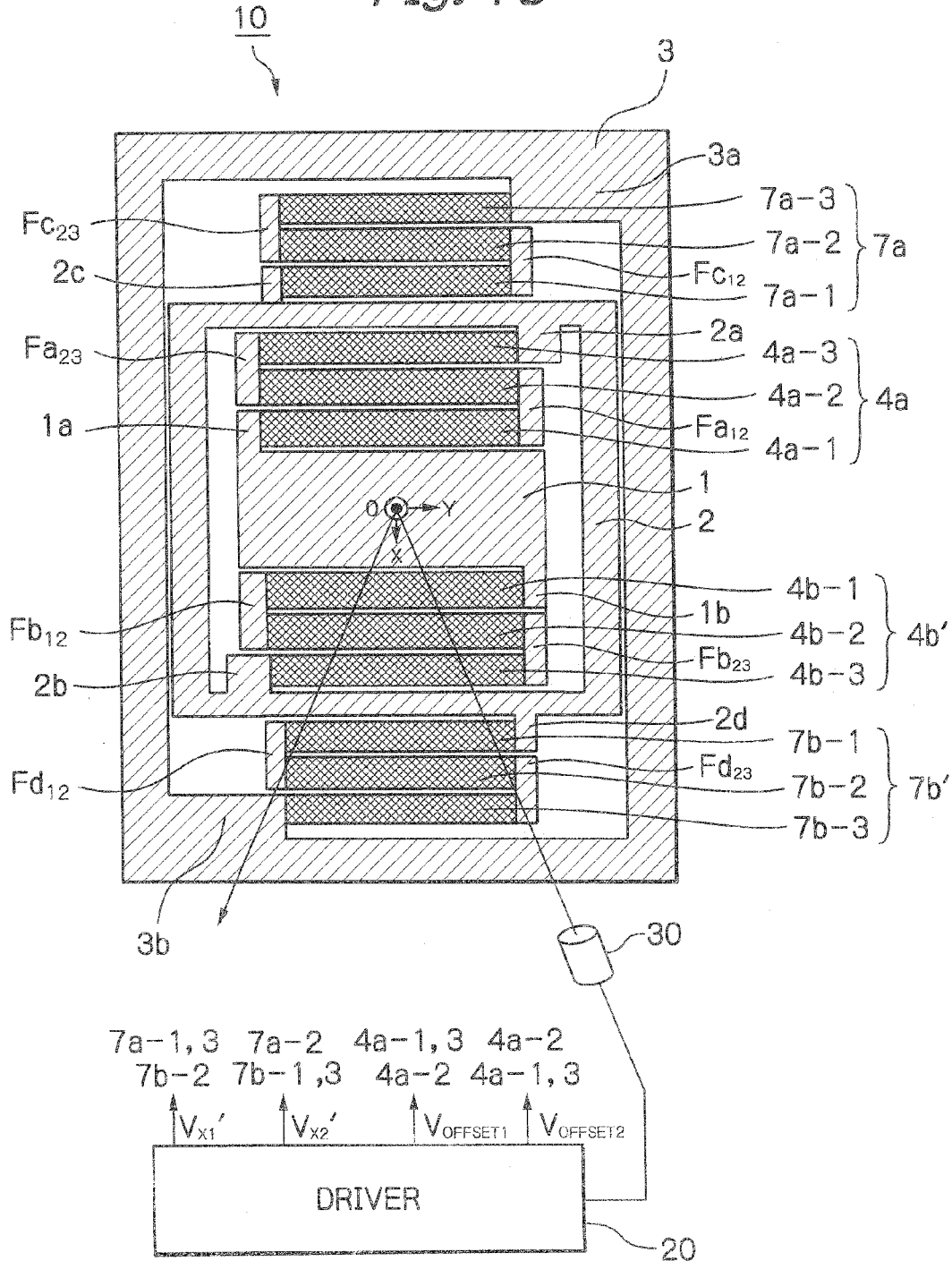
FIG. 13 is a plan view illustrating a sixth modification of the optical deflector apparatus of FIG. 6.

In FIG. 13, which illustrates a sixth modification of the deflector apparatus of FIG. 6, the meander-type outer piezoelectric actuator 7b of FIG. 12 is replaced by a meander-type outer piezoelectric actuator 7b' which is symmetrical to the meander type outer piezoelectric actuator 7a of FIG. 12 with respect to the center 0 of the mirror 1. The operation of the optical deflector of FIG. 13 is the same as that of the optical deflector of FIG. 12, except that the rocking saw-tooth drive voltage $V_{X1}'$ is applied by the driver 20 to the piezoelectric cantilevers 7a-1, 7a-3, 7b-1 and 7b-3, and the rocking saw-tooth drive voltage $V_{X3}'$ is applied by the driver 20 to the piezoelectric cantilevers 7a-2, 7b-1 and 7b-2.

Even in FIGS. 8, 9, 10, 11, 12 and 13, the meander-type outer piezoelectric actuators 7a and 7b (7b') are specialized for a rocking operation mode around the X-axis, and the meander-type inner piezoelectric actuators 4a and 4b (4b') are specialized for an offset operation mode around the X-axis. However, the meander-type inner piezoelectric actuators 4a and 4b (4b') can be specialized for a rocking operation mode around the X-axis, and the meander-type outer piezoelectric actuators 7a and 7b (7b') can be specialized for an offset operation mode around the X-axis.

Figure 14:
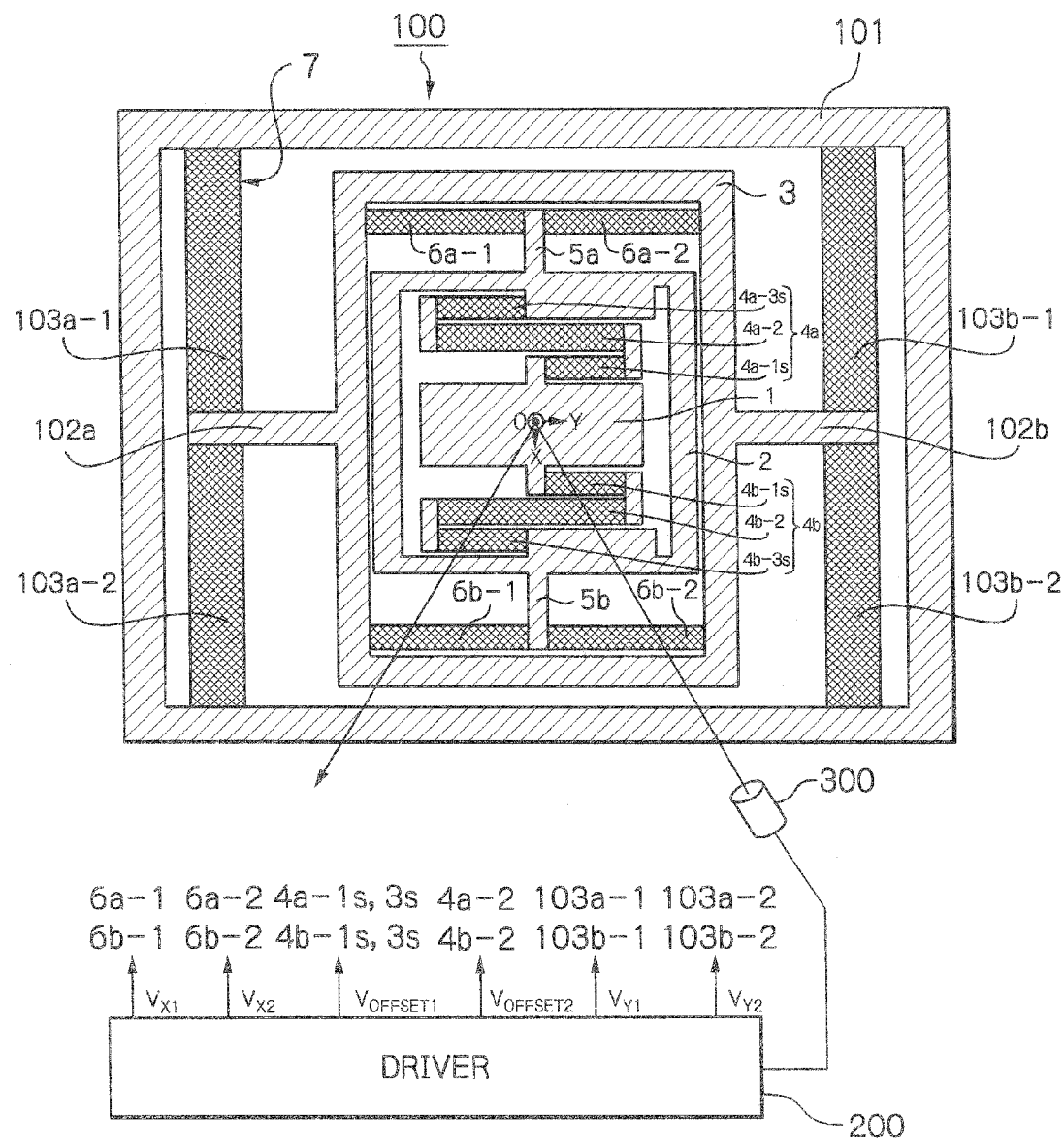
FIG. 14 is a plan view illustrating a third embodiment of the optical deflector apparatus according to the presently disclosed subject matter.

In FIG. 14, which illustrates a third embodiment of the optical deflector apparatus according to the presently disclosed subject matter as a two-dimensional MEMS device, reference numeral 100 designates a two-dimensional optical deflector, 200 designates a driver, and 300 designates a laser light source.

The optical deflector 100 includes the optical deflector 10 of FIG. 1. Additionally, in order to carry out another rocking operation mode around the Y-axis, the optical deflector 100 includes another outer frame (fixed frame) 101, a pair of torsion bars 102a and 102b coupled to the outer circumference of the outer frame 3 along the Y-axis, and linear outer piezoelectric actuators 103a-1 and 103a-2 coupled between the torsion bar 102a and the outer frame 101, and linear outer piezoelectric actuators 103b-1 and 103b-2 coupled between the torsion bar 102b and the outer frame 101. In this case, the outer frame 3 serves as a movable frame. The flexing direction of the outer piezoelectric actuators 103a-1 and 103b-1 is opposite to that of the outer piezoelectric actuators 103a-2 and 103b-2, so that each of the outer piezoelectric actuators 103a-1, 103a-2, 103b-1 and 103b-2 serves as cantilevers for rocking the mirror 1 around the Y-axis. Note that the torsion bars 102a and 102b can be coupled to the outer frame 101.

Figure 3:
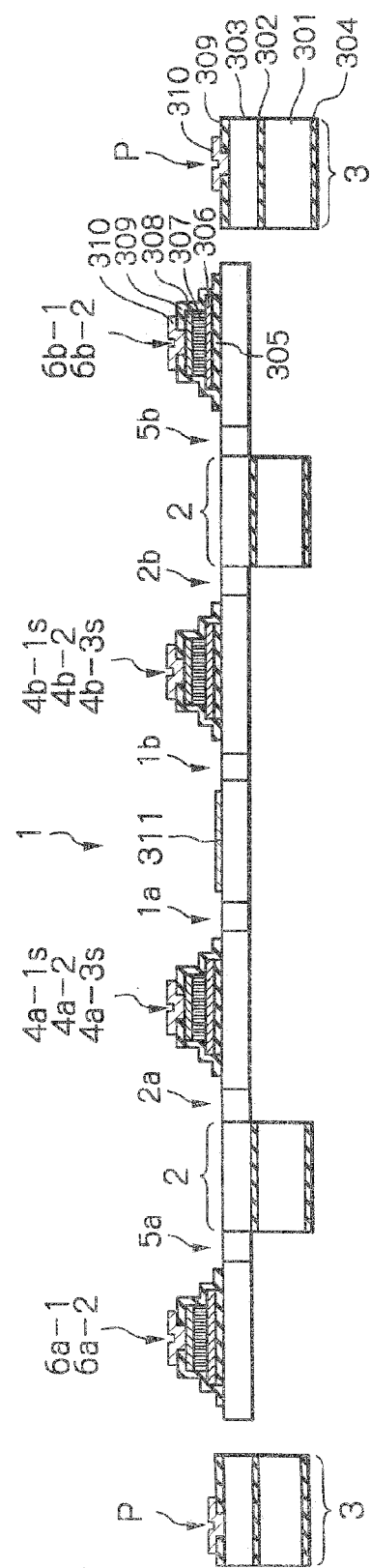
FIG. 3 is a cross-sectional view of the optical deflector of FIG. 1.

The outer frame 101 has the same structure as the outer frame 3 as illustrated in FIG. 3. In this case, the pads P are formed on the outer frame 101, not on the outer frame 3. Also, the torsion bars 102a and 102b have the same structure as the torsion bars 5a and 5b as illustrated in FIG. 3. Further, the linear piezoelectric actuators 103a-1, 103a-2, 103b-1 and 103b-2 have the same structure as the linear piezoelectric actuators 6a-1, 6a-2, 6b-a and 6b-2 as illustrated in FIG. 3.

The rocking operation of the mirror 1 by the outer piezoelectric actuators 103a-1, 103a-2, 103b-1 and 103b-2 in a rocking operation mode around the Y-axis will be explained below.

Figure 15:
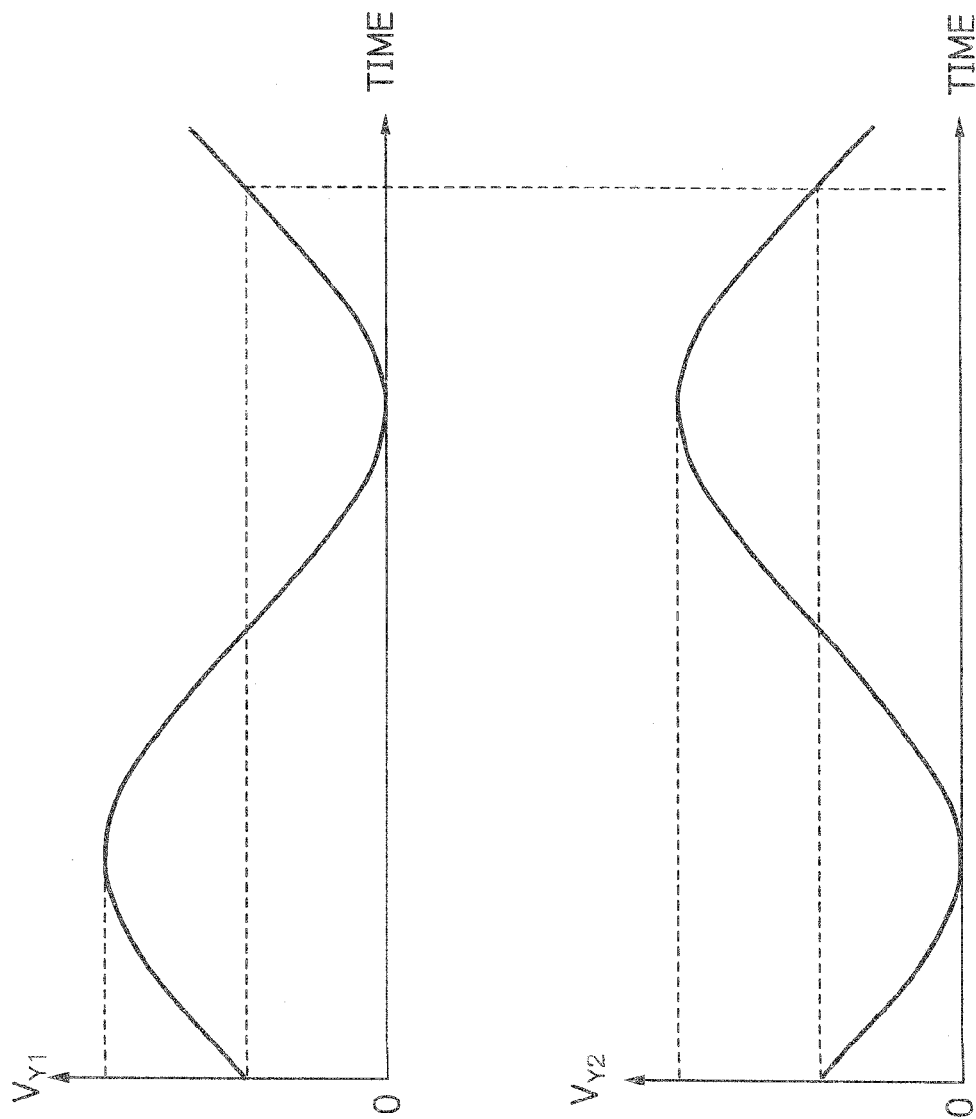
FIGS. 15A and 15B are timing diagrams of the drive voltages applied to the piezoelectric actuators of FIG. 14.

Rocking sinusoidal-wave drive voltages $V_{Y1}$ and $V_{Y2}$ opposite in phase to each other as illustrated in FIGS. 15A and 15B are applied by the driver 200 to the outer piezoelectric actuators 103a-1 and 103a-2, respectively, so that the outer piezoelectric actuators 103a-1 and 103a-2 carry out flexing operations in opposite directions to each other, which would distort the torsion bar 102a in a direction to cause a torque in the mirror 1 around the Y-axis. Simultaneously, the above-mentioned rocking sinusoidal-wave drive voltages $V_{Y1}$ and $V_{Y2}$ are applied by the driver 200 to the outer piezoelectric actuators 103b-1 and 103b-2, respectively, so that the outer piezoelectric actuators 103b-1 and 103b-2 carry out flexing operations in opposite directions to each other, which would distort the torsion bar 102b in the above-mentioned direction to cause a torque in the mirror 1 around the Y-axis. As a result, the torsion bars 102a and 102b are twisted to rock the mirror 1 around the Y-axis. The frequency $f_Y$ of the rocking sinusoidal-wave drive voltages $V_{Y1}$ and $V_{Y2}$ is 60 Hz, for example, much lower than the resonant frequency $f_X$ of the sinusoidal-wave drive voltages $V_{X1}$ and $V_{X2}$.

Figure 16:
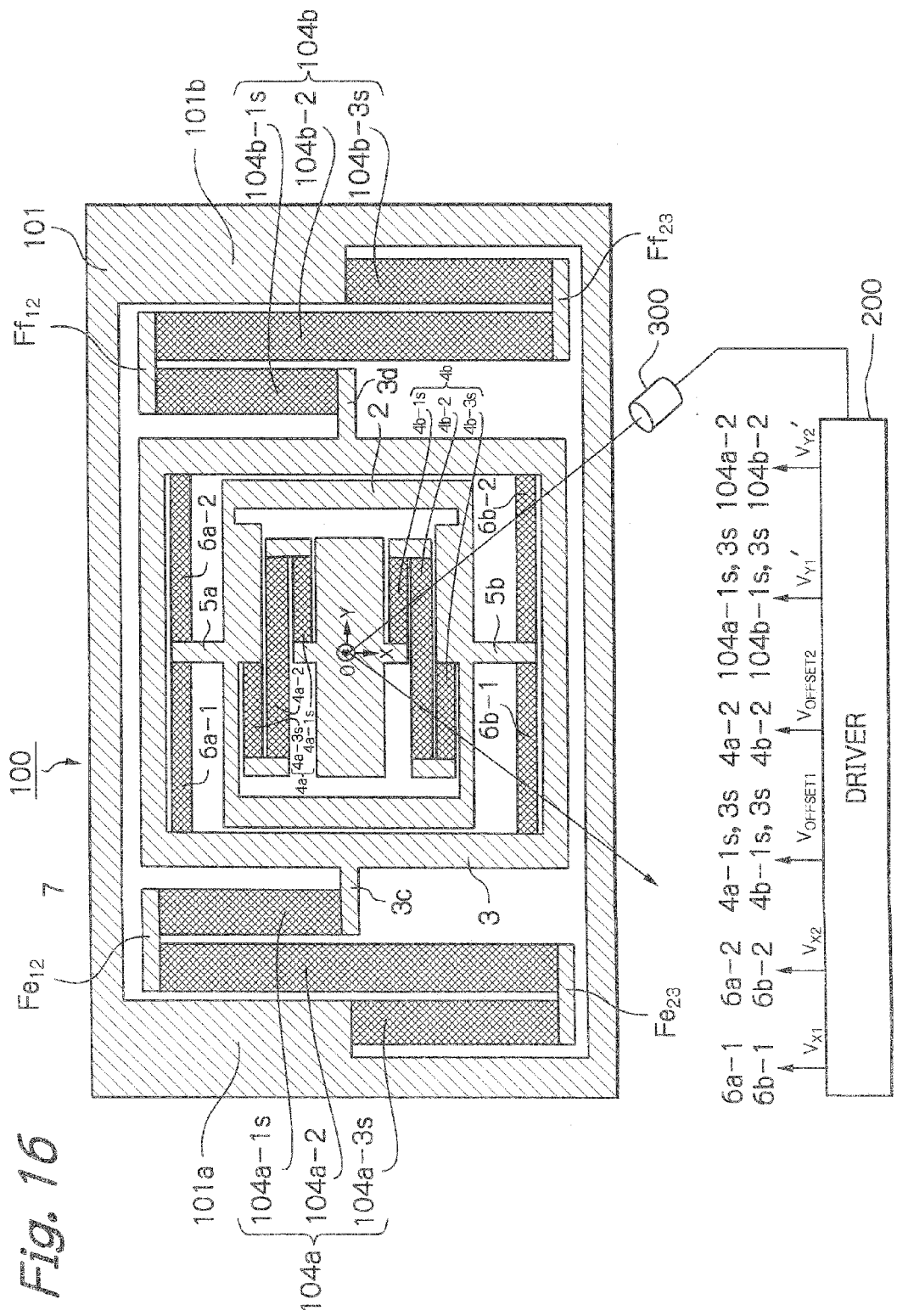
FIG. 16 is a plan view illustrating a fourth embodiment of the optical deflector apparatus according to the presently disclosed subject matter.

In FIG. 16, which illustrates a fourth embodiment of the optical deflector apparatus according to the presently disclosed subject matter as a two-dimensional MEMS device, the torsion bars 102a and 102b and the linear piezoelectric actuators 103a-1, 103a-2, 103b-1 and 103b-2 of FIG. 14 are replaced by a pair of meander-type piezoelectric actuators 104a and 104b which are symmetrical to each other with respect to the X-axis.

In more detail, the piezoelectric actuator 104a is constructed by piezoelectric actuators 104a-1s, 104a-2 and 104a-3s which are serially coupled from an outer coupling portion 3c of the outer frame 3 to a coupling portion 101a of the outer frame 101 via folded portions $Fe_{12}$ and $Fe_{23}$. Also, each of the piezoelectric cantilevers 104a-1s, 104a-2 and 104a-3s are in parallel with the X-axis. Therefore, the piezoelectric actuators 104a-1s, 104a-2 and 104a-3s are folded at their ends or meandering from the outer frame 3 to the outer frame 101, so that amplitudes of the piezoelectric actuators 104a-1s, 104a-2 and 104a-3s can be changed along directions perpendicular to the Y-axis.

Similarly, the piezoelectric actuator 104b is constructed by piezoelectric actuators 104b-1s, 104b-2 and 104b-3s which are serially coupled from an outer coupling portion 3d of the outer frame 3 to a coupling portion 101a of the outer frame 101 via folded portions $Ff_{12}$ and $Ff_{23}$. Also, each of the piezoelectric cantilevers 104b-1s, 104b-2 and 104b-3s are in parallel with the X-axis. Therefore, the piezoelectric actuators 104b-1s, 104b-2 and 104b-3s are folded at their ends or meandering from the outer frame 3 to the outer frame 101, so that amplitudes of the piezoelectric actuators 104b-1s, 104b-2 and 104b-3s can be changed along directions perpendicular to the Y-axis.

The meander-type piezoelectric actuators 104a and 104b operate in the same way as the meander-type piezoelectric actuators 4a and 4b.

Thus, the mirror 1 is rocked around the Y-axis by the piezoelectric actuators 104a and 104b.

Note that the number of piezoelectric cantilevers 104a and 104b can be other values such as 4, 5, . . . .

The meander-type piezoelectric actuators 104a and 104b have the same structure as the meander-type piezoelectric actuators 4a and 4b as illustrated in FIG. 3.

The rocking operation by the piezoelectric actuators 104a and 104b in a rocking operation around the Y-axis will be explained below.

Figures 17A, 17B:
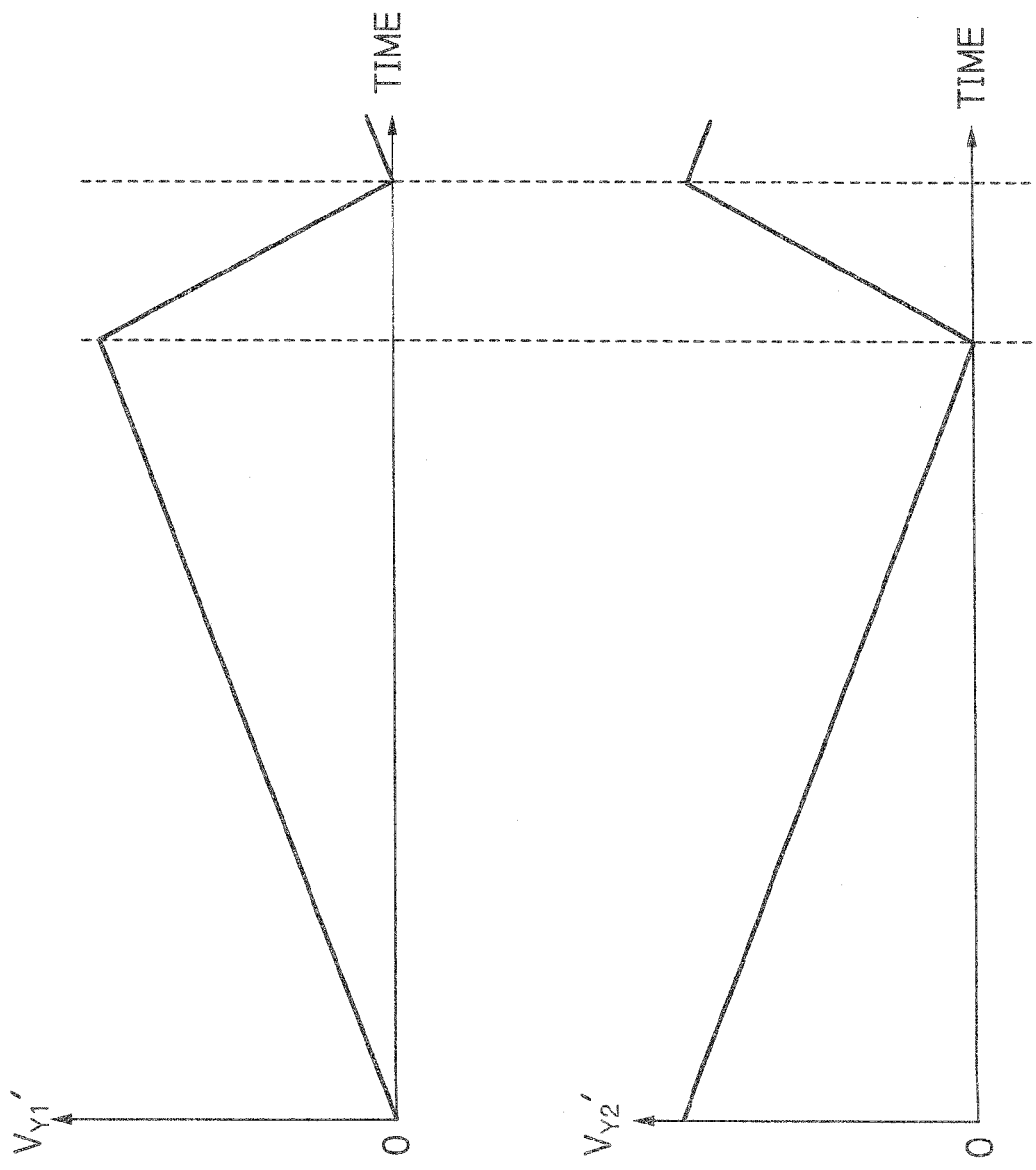
FIGS. 17A and 17B are timing diagrams of the drive voltages applied to the piezoelectric actuators of FIG. 16.

A rocking saw-tooth drive voltage $V_{Y1}'$ as illustrated in FIG. 17A is applied by the driver 200 to the odd-numbered piezoelectric cantilevers 104a-1s and 104a-3s of the outer piezoelectric actuator 104a and the odd-numbered piezoelectric cantilevers 104b-1s and 104b-3s of the outer piezoelectric actuator 104b. Similarly, a rocking saw-tooth drive voltage $V_{Y2}'$ as illustrated in FIG. 17B is applied by the driver 200 to the even-numbered piezoelectric cantilever 104a-2 of the outer piezoelectric actuator 104a and the even-numbered piezoelectric cantilever 104b-2 of the outer piezoelectric actuator 104b. Therefore, the odd-numbered piezoelectric cantilevers 104a-1s, 104a-3s, 104b-1s, 104b-3s and the even-numbered piezoelectric cantilevers 104a-2 and 104b-2 carry out flexing operations in phase with each other. As a result, the mirror 1 is rocked around the Y-axis. Even in this case, the frequency $f_y$ of the rocking saw-tooth drive voltages $V_{Y1}'$ and $V_{Y2}'$ is 60 Hz, for example, much lower than the resonant frequency $f_X$ of the sinusoidal-wave drive voltages $V_{X1}$ and $V_{X2}$.

In FIG. 16, the length of piezoelectric cantilevers 104a-1s, 104a-3s, 104b-1s and 104b-3s is half of the piezoelectric cantilever 104a-2 and 104b-2; however, the length of piezoelectric cantilevers 104a-1s, 104a--3s, 104b-1s and 104b-3s can be the same as that of the piezoelectric cantilever 104a-2 and 104b-2. Also, the piezoelectric actuators 104a and 104b can be symmetrical to each other with respect to the center 0 of the mirror 1.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. An optical deflector apparatus comprising:
   a mirror;
   an inner frame surrounding said mirror;
   a first outer frame surrounding said inner frame;
   an inner piezoelectric actuator coupled between said mirror and said inner frame and adapted to flex said mirror around a first axis of said mirror;
   a first outer piezoelectric actuator coupled between said inner frame and said first outer frame and adapted to flex said mirror around said first axis of said mirror;
   a driver adapted to generate an offset drive voltage and a first rocking drive voltage,
   said offset drive voltage being applied to a first piezoelectric actuator selected from said inner piezoelectric actuator and said outer piezoelectric actuator,
   said first rocking drive voltage being applied to a second piezoelectric actuator different from said first piezoelectric actuator, selected from said inner piezoelectric actuator and said first outer piezoelectric actuator.

2. The optical deflector apparatus as set forth in claim 1, wherein said first piezoelectric actuator comprises a first group of piezoelectric cantilevers and a second group of piezoelectric cantilevers alternating said first group of piezoelectric cantilevers folded at their ends and in parallel with a second axis of said mirror,
   wherein said offset drive voltage is applied to said first group of piezoelectric cantilevers and an inverted voltage of said offset drive voltage is applied to said second group of piezoelectric cantilevers.

3. The optical deflector apparatus as set forth in claim 2, wherein said offset drive voltage is rectangular-wave shaped in an active period and is pulse-shaped in a blanking period.

4. The optical deflector apparatus as set forth in claim 1, wherein said second piezoelectric actuator comprises:
   a first torsion bar coupled to said inner frame;
   a pair of first linear piezoelectric actuators coupled between said inner frame and said first outer frame,
   wherein said first rocking drive voltage is applied to one of said first linear piezoelectric actuators, and an inverted voltage of said first rocking drive voltage is applied to the other of said first linear piezoelectric actuators.

5. The optical deflector apparatus as set forth in claim 4, wherein said first rocking drive voltage is sinusoidal-waved.

6. The optical deflector apparatus as set forth in claim 1, wherein said second piezoelectric actuator comprises a third group of piezoelectric cantilevers and a fourth group of piezoelectric cantilevers alternating said third group of piezoelectric cantilevers folded at their ends and in parallel with a second axis of said mirror,
   wherein said first rocking drive voltage is applied to said third group of piezoelectric cantilevers and an inverted voltage of said first rocking drive voltage is applied to said fourth group of piezoelectric cantilevers.

7. The optical deflector apparatus as set forth in claim 6, wherein said first rocking drive voltage is saw-tooth-wave shaped.

8. The optical deflector apparatus as set forth in claim 1, further comprising:
   a second outer frame surrounding said first outer frame;
   a second outer piezoelectric actuator adapted to rock said mirror around a second axis of said mirror,
   said driver adapted to further generate a second rocking drive voltage,
   said second rocking drive voltage being applied to said second outer piezoelectric actuator.

9. The optical deflector apparatus as set forth in claim 8, wherein said second outer piezoelectric actuator comprises:
   a second torsion bar coupled to said inner frame;

a pair of second linear piezoelectric actuators coupled between said second torsion bar and said second outer frame, wherein said second rocking drive voltage is applied to one of said second linear piezoelectric actuators, and an inverted voltage of said second rocking drive voltage is applied to the other of said second linear piezoelectric actuators.

10. The optical deflector apparatus as set forth in claim 9, wherein said second rocking drive voltage is sinusoidal-waved.

11. The optical deflector apparatus as set forth in claim 10, wherein said second rocking drive voltage is saw-tooth-wave shaped.

12. The optical deflector apparatus as set forth in claim 8, wherein said second outer piezoelectric actuator comprises a fifth group of piezoelectric cantilevers and a sixth group of piezoelectric cantilevers alternating said fifth group of piezoelectric cantilevers folded at their ends and in parallel with said first axis of said mirror, wherein said second rocking drive voltage is applied to said fifth group of piezoelectric cantilevers, and an inverted voltage of said fifth rocking drive voltage is applied to said sixth group of piezoelectric cantilevers.

* * * * *